(12) United States Patent
Jungreis et al.

(10) Patent No.: US 7,768,526 B2
(45) Date of Patent: Aug. 3, 2010

(54) GRAPHICAL OBJECT GENERATION AND REGENERATION

(75) Inventors: Irwin Jungreis, Sudbury, MA (US); Michael R. Lauer, Harvard, MA (US)

(73) Assignee: Autodesk, Inc., San Rafael, CA (US)

( * ) Notice: Subject to any disclaimer, the term of this patent is extended or adjusted under 35 U.S.C. 154(b) by 104 days.

(21) Appl. No.: 11/050,465

(22) Filed: Feb. 3, 2005

(65) Prior Publication Data
US 2005/0209831 A1    Sep. 22, 2005

Related U.S. Application Data

(63) Continuation of application No. 09/713,492, filed on Nov. 15, 2000, now abandoned.

(51) Int. Cl.
*G09G 5/00* (2006.01)

(52) U.S. Cl. .................. 345/619; 345/419; 345/420; 703/2; 707/102; 715/964; 715/965; 715/966; 715/967

(58) Field of Classification Search .................. 345/621; 715/964–967
See application file for complete search history.

(56) References Cited

U.S. PATENT DOCUMENTS

| | | | |
|---|---|---|---|
| 5,019,961 A | | 5/1991 | Addesso et al. |
| 5,251,290 A | * | 10/1993 | Pabon ..................... 345/420 |
| 5,444,836 A | * | 8/1995 | Hollingsworth et al. ..... 345/634 |
| 5,479,601 A | | 12/1995 | Matheny et al. |
| 5,535,386 A | | 7/1996 | Wang |
| 5,692,184 A | * | 11/1997 | Ardoin et al. ........... 707/103 R |
| 5,850,535 A | | 12/1998 | Maystrovsky et al. |
| 5,856,828 A | * | 1/1999 | Letcher, Jr. ................. 345/420 |
| 5,923,573 A | * | 7/1999 | Hatanaka ...................... 703/2 |
| 6,035,305 A | * | 3/2000 | Strevey et al. ..................... 1/1 |
| 6,052,691 A | * | 4/2000 | Ardoin et al. ............... 707/102 |
| 6,056,428 A | * | 5/2000 | Devoino et al. ................ 703/2 |

OTHER PUBLICATIONS

"Null Cycle" 1998-2004, Computer Hope™, at http://www.computerhope.com/jargon/n/nullcycl.htm, retrieved from the internet on Feb. 10, 2004.

* cited by examiner

*Primary Examiner*—Antonio A Caschera
(74) *Attorney, Agent, or Firm*—Fish & Richardson P.C.

(57) ABSTRACT

A method of propagating changes in a design model identifies a change to a changed element, creates steps to carry out the change, creates additional steps based on the change and on relationships between the changed element and other elements in the design model, and executes the steps to alter the model in a manner that reflects the change. The steps may be created in a manner that depends on other steps that have been created. A system for regenerating a design model comprises a model element, a step propagator, and a step executor. The step propagator receives a first step that represents changes in the model element, and produces a second step that represents other changes in the model element that are dependent on the first step, and the step executor executes the first and second steps.

6 Claims, 6 Drawing Sheets

GRAPHICAL OBJECT GENERATION AND REGENERATION

This application is a continuation and claims the benefit of priority under 35 USC 120 of U.S. application Ser. No. 09/713,492, filed Nov. 15, 2000 now abandoned, the contents in its entirety are hereby incorporated by reference.

BACKGROUND

This invention relates to generation and regeneration of graphical elements in a computer-aided design system.

Computer systems that display graphical elements, such as computer-aided design (CAD) systems, need to manage the elements and display the elements properly as elements are added, deleted, moved, or modified. Management of graphical elements can be particularly difficult in three-dimensional design systems, and in situations in which the elements are linked to metadata. For instance, a designer working at a graphics terminal may be working on a full model of an object, but the terminal may only be displaying a portion of the model at any one time. At times, it may be necessary to regenerate the portion of the model on which the designer is working, or it may be necessary to regenerate a portion of the model to which the designer would like to move. It may also be necessary to regenerate elements that the user has changed and to propagate the changes to other elements that are associated with, or constrained by, the changed element. Before a portion of the model may be regenerated, the system must compute the location and appearance of graphical element in the model. Between regenerations, individual drawing elements can be altered without having to re-compute a large group of elements. But the ability to alter the display of a model with changes only to individual elements in the model ultimately is limited. In addition, it is helpful to provide a designer with multiple views of a three-dimensional model. In such a situation, if the designer makes changes to the model in one view, it may be necessary to reflect those changes in the other views.

It is desirable to increase the speed of the regeneration process, or alternatively, to decrease the time it takes to perform a regeneration. However, it is generally necessary that any changes that have occurred to a model since the last regeneration be taken into account in future regenerations and be reflected appropriately in all views. Thus, if the drawing model is a model of a house, a movement of a door or window by an architect working with the system should be reflected after the door or window has been moved, and should be reflected in a plan view, an elevation view, or in a three-dimensional view. At the same time, it is also desirable that the model properly reflect parametric constraints that have been placed on the model elements by the user or by the system. For example, if a user moves a wall, the system should also move any elements, such as windows or doors, located in the wall. Thus, an accurate yet speedy system for generating graphic elements is desirable.

SUMMARY

The present invention is capable of generating images in which changes have occurred to the model represented by the image. In one embodiment, a method of propagating changes made to a design model having one or more elements, changes an element, creates one or more steps to carry out the change to the element, creates additional steps derived from relationships between the element and other elements, and executes at least some of the steps to change the elements o produce a model that accurately reflects the changes to the model. The method may be used with a computer-aided design system, and may also involve sorting of the steps, for example, using a depth-first sorting method. The type of steps that are created and executed may depend on previous steps that have been created, so as to form a context-dependent propagation. In addition, one or more of the steps may be nul steps, including nul steps that initiate regeneration. Atoms may be associated with each element, and may mark changes that have been made to the element and be associated with one or more steps that are executed.

In another embodiment, a system for regenerating a design model comprises a model element and a step propagator that receives a first step representing changes that have been made to the model, and produces a second step that represents other changes in the model element that are dependent on the first step. The system may also comprise a step executor that executes the steps, and a step sorter that sorts the steps according to dependencies between the steps. An atom may link the model element to the first step.

In yet another embodiment, a method for propagating changes through a plurality of elements in a design model may comprise analyzing changes in a first element, generating a step to carry out at least some of the changes, generating a first plurality of steps based on a predefined relationship between the first element and one or more other elements, or upon changes in a predefined relationship between the first element and one or more other elements, and executing the steps to reflect changes in the model. The method may also generate a second plurality of steps that are based on the first plurality of steps and relationships among the plurality of elements. The method may also sort the steps to ensure that a step is not executed before one of the steps on which it depends. The method, in particular embodiments, may generate steps through prediction or through guessing. The method may also verify that the steps were carried out in the proper order.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
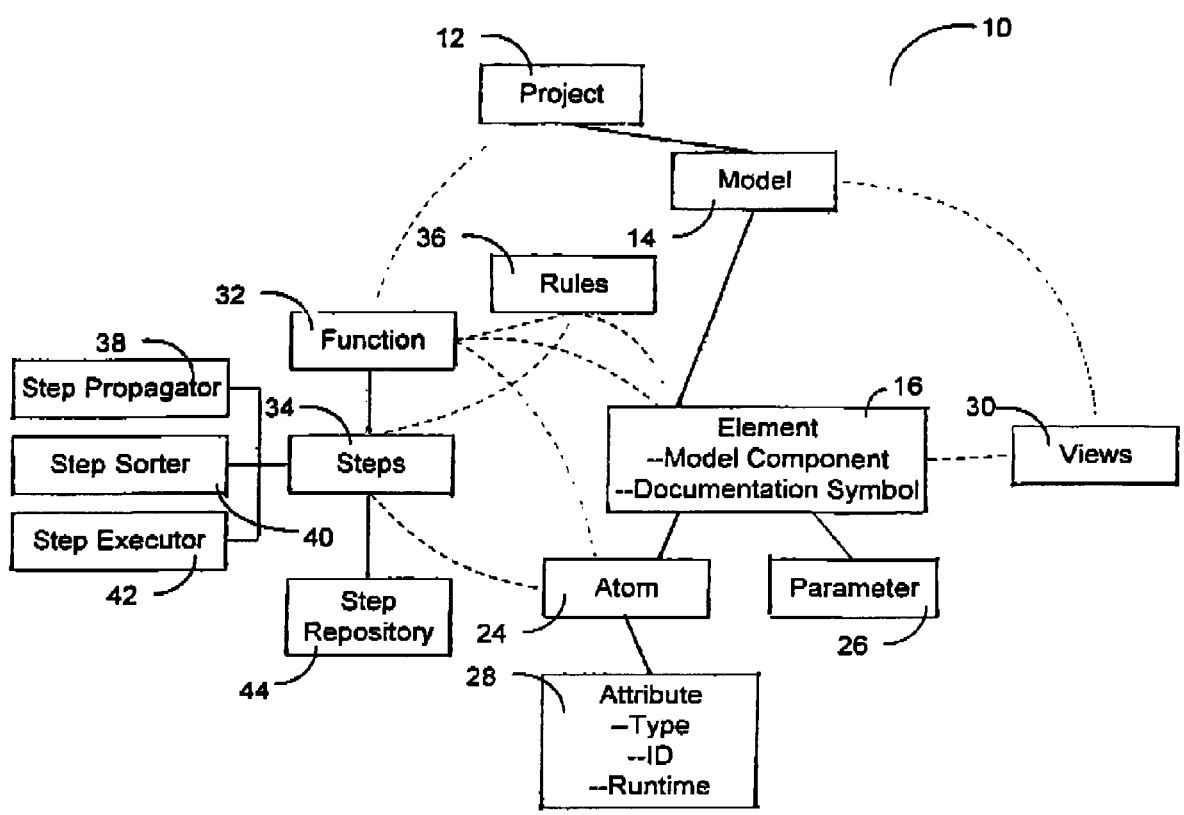
FIG. 1 is a conceptual diagram of a system for producing and displaying graphic images.

FIG. 1 illustrates a conceptual diagram of a system 10 for producing and displaying graphic images, with structural relationships generally illustrated by solid lines and functional relationships illustrated by dashed lines. In general, the depicted system 10 is adapted to be used for parametric computer-aided design. Parametric design relates a drawing element 16 (also known as a parametric component) to metadata that reflects or controls the drawing element. Because a parametric design system tracks information about the design elements 16, it can be constructed to deliver powerful results. For example, a wall may be associated with a parameter that reflects the height of the wall. If a user changes the wall height in a drawing, the value of the parameter will change. Alternatively, if the user changes the value of the parameter, the wall height will change.

In addition, interactions between and among elements 16 may be tracked and controlled so that if one element 16 is changed by a user, other elements 16 may be changed automatically by system 10. For example, two walls can be given a parameter that defines their distance from each other, so that when one wall is moved, the other wall will be moved the same distance and direction automatically. This differs from non-parametric systems, which associate less information with drawing elements. For example, in such systems, a wall could simply be represented as a closed box of four lines (or four planes), but the system could retrieve little information about the wall.

The system 10 depicted in FIG. 1 relies on both structural and functional components. Project 12 represents the whole of the information or data that is needed to describe a particular design task, and which can be joined together to develop one or more related designs. At the center of project 12 is a design model 14 or models that represent an object that is to be designed in system 10. For example, model 14 could be an electronic three-dimensional representation of a building or other such object. Project 12 could comprise model 14 and could also comprise other information about the design, such as scheduling information, material lists for the model, settings that are saved with the model, and other information. Project 12 may be stored in a single file or database, or it may be stored in a number of files or databases.

Model 14 is made up of a number of parametric elements 16. Element 16 is a basic unit that makes up part of a model, for example, a line, wall, roof, floor, dimension, annotation symbol, furniture, section, column grid, or level. Elements 16 may be made up of collections of other elements 16.

Each element 16 may be given an element ID that is unique to the particular element within project 12. An element ID may be expressed as an integer, and system 10 may restrict access to the element ID to enforce the integrity of the data in each element. An element ID also may provide a convenient manner by which to refer to element 16 so that element 16 can be altered or otherwise managed.

Among the classes of elements 16 that may exist in model 14 are model components and documentation symbols. A model component is an element 16 that defines a physical portion of model 14, and may include windows, doors, walls, roofs, or simply lines. A documentation symbol is an element 16 that is used to define or describe model 14, and may include dimensions, arrows, leaders, notes, and other text or markers. Documentation symbols can relate to model components, for example, where a dimension depends on the distance between two walls that are model components.

A group of atoms 24 may be associated with element 16. An atom 24 is simply an abstract representation of a piece of data that can be changed or regenerated. An atom 24 is generally the smallest piece of identifiable data about element 16. For example, element 16 may be a curved wall, and the associated atoms 24 could be the thickness of the wall and three points that define the curve of the wall. Any given element 16 may have a unique set of atoms 24, so that there is no set relationship between atoms 24 and element 16. Rather, element 16 can be created to meet particular design needs and can even contain other elements 16. For instance, a window element 16 could be created by combining several geometric constructs, such as surfaces, arcs, lines, or volumes, that are themselves elements 16 and are made up of atoms 24.

Atoms 24 may provide for communication of information between element 16, function 32, step 34, and rules 36 (described below). Atoms may be stored separately from these other items, and do not have to be data in element 16. For example, an atom 24 that is the result of step 34 may indicate that execution of step 34 modifies the piece of data corresponding to the atom 24. Atoms 24 do not need to correspond to particular data; rather, an atom 24 may correspond to an operation that creates or modifies multiple pieces of data. Alternatively, an atom 24 could be used as a placeholder to propagate steps, and could not correspond to any data from model 14 at all.

Element 16 may also contain one or more parameters 26 that serve to define element 16. Each parameter 26 may be associated with an atom 24. For example, a door element 16 could have an atom 24 that represents a particular feature of the door, and the value of the parameter 26 that is associated with atom 24 could define one of a number of ways in which the door could be displayed. Parameters 26 may take on a number of types, including integer, floating-point, or string.

Each atom 24 may be defined by one or more attributes 28. Attribute 28 constitutes the information that defines the particular atom 24. In particular, attribute 28 can include a type, an element ID, a runtime class, or other data. The type of atom 24 represents the sort of data that is stored by atom 24, or the sort of process carried out by atom 24. For example, the atom 24 associated with the center line of a wall may have a type AtomUnboundCurve, which represents that the center line can be represented by a curve that is not bound by another item. An element ID identifies the element 16 to which atom 24 relates, and may be expressed as a unique integer. The element ID may be assigned by system 10 to element 16 when it is first created, and may be used to distinguish element 16 and its atoms 24 from other elements and their atoms.

A runtime class may represent wildcard dependencies, which are dependencies on all of the elements 16 of a particular type, rather than on a single element 16. A runtime class may be represented as metadata, and may also be displayed. For example, an element 16 having a runtime class may keep track of all the rooms in model 14, and may deduce where a particular room is located by examining walls and lines in model 14. Such an element 16 would depend, among other things, on the centerlines of each of the walls that defines every room, and the atom representing the dependency would not need to have a particular element ID. In such a manner, the area of rooms in model 14 can be tracked automatically even as changes are made to model 14.

The physical structure of model 14 can be perceived through various views 30. Views 30 interact with elements 16 and model 14 to provide the user of system 10 with various visual representations of elements 16 in model 14. For example, when a user works on model 14 at a computer workstation, the display on the workstation may utilize one or more windows to show model 14 from different angles, such as a plan view and an elevation view. Views 30 can be selected on-the-fly by the user, and information that enables a particular view to be produced can be related to model 14 and saved as part of project 12. For example, a view 30 of a three-dimensional model from a particular angle could be saved so that the view 30 could be recalled later. In addition, system 10 may be configured so that particular elements 16 are displayed differently in different views, such as by a symbolic representation in one view and a realistic representation in another view. For example, a door element when viewed in a plan view could include an arc for an imaginary door swing, while the same door element view from an angle could simply be a hole in a wall or a realistic six-panel door located in the wall. Alternatively, using virtual reality, system 10 may provide a user with views 30 that change constantly according to the user's movements or other choices so as to give the user a sense that model 14 is real. Also, although views 30 are depicted in FIG. 1 as interacting with elements 16 and model 14, a view could also be an element 16 itself.

It is important for system 10 to display elements 16 in model 14 accurately, whether elements 16 have just been added to model 14 or have undergone a number of manipulations since being added to model 14. Accurate display can be particularly vexing in parametric modeling systems because system 10 must take into account any dependencies or constraints that have been created between elements 16. For example, model 14 may be established so that two walls must remain parallel to each other and be spaced a fixed distance apart. Therefore, if one wall is moved or rotated, system 10 must ensure that the change is propagated to the other wall, whose position is dependent on the position of the first wall. Likewise, the position of the first wall will need to be changed if any changes are made to the position of the second wall. Although this is an extremely simple example, it indicates the importance to the integrity of model 14 that changes be propagated properly throughout the elements 16 in model 14. In particular, the integrity of the data in model 14 affects the manner in which views 30 interact with model 14, and also affects the ability of model 14 to reflect accurately what model 14 is intended by a user to reflect.

Several components of system 10 propagate changes that are made to elements 16 in model 14 when the model is regenerated. In general, function 32 may be performed on an element or elements 16, and through rules 36, may impose certain actions or functions on other elements. Each time an element 16 is changed in the course of modifying model 14, the atom or atoms 24 that correspond to the changed data are "touched." Each time atom 24 is touched, some sort of alteration or multiple alterations will need to be made to model 14 when model 14 is regenerated. The alterations are carried out by one or more steps 34 when regeneration of the model occurs. System 10 may provide a step repository 44 to organize the touched atoms 24 and the steps 34 that are created to alter the atoms 24. Step repository 44 may store indicators for the changed atoms 24, it may store steps 34 that are computed as atoms 24 are changed, or it may store both. Additional steps 34 may be created during regeneration and stored in step repository 44. Step 34 may make changes to an element or serve as a placeholder to indicate that a change has already been made to an element.

Function 32, rules 36, and steps 34 all interact with model 14 so that all of the changes that have been propagated through elements 16 in system 10 are accurately reflected in model 14. For example, a "move" function 32 may be performed on one wall of a pair of walls that are defined to be separated by a fixed distance. The fixed distance between the walls imposes a rule 36 that constrains the position of one wall to be dependent on the position of the other wall. Thus, when the first wall is moved (e.g., by a user), because of rule 36, the second wall must also be moved (e.g., automatically by the system). The actions that must be taken to move both walls, and that are created as a result of the move function 32, are performed by steps 34.

The steps 34 act on data corresponding to atoms 24 in model 14 during regeneration to transform that data (or create new data) so that the data accurately reflects changes that have been made to model 14, and also reflect changes that need to be made to model 14 because of the original changes. Regeneration is the process by which changes made to certain elements 16 in model 14 are propagated through model 14 to other elements 16 that are dependent upon, or constrained by, the first elements 16. Step 34 represents a portion of a regeneration cycle. By correctly selecting and properly ordering the steps 34, system 10 can minimize the time that it takes to regenerate model 14 or a portion of model 14, and can also minimize any interference between steps 34 so that model 14 is accurately represented in project 12.

Steps 34 that will be performed on atoms 24 during regeneration may be produced or managed by step executor 42, and may be stored in step repository 44. System 10 may also store data regarding which atoms 24 or elements 16 have been touched or affected in step repository 44, and may later use this information to generate corresponding steps 34. In addition, system 10 may store information regarding all elements that depend on an element 16 whose atom 24 has been touched, so that changes may be propagated to those elements. Steps 34 to carry out the changes may be created immediately, or their creation may be delayed, for example, until regeneration occurs. Step executor 42 may treat atoms 24 according to the manner in which they are familially related. For example, a step whose execution depends on some piece of data would report the atom corresponding to that piece of data as a parent; when the data corresponding to the parent atom is changed, the step needs to be executed, changing the data corresponding to the result atom Likewise, any child atom of the child atom (i.e., a grandchild atom) could also need to be changed. Because higher generations of atoms by definition affect lower generations of atoms, step propagator 38 may work from top to bottom through the family tree of atoms 24, so that a step that is associated with a child is handled after the steps of all its parents and other upstream relatives.

System 10 can create steps for all kinds of functions 32, including move, rotate, mirror, and copy. In addition, if element 16 is deleted, system 10 may create steps so that any elements that depend on element 16 reflect the deletion properly. In addition, newly added elements 16 may create changes to system 10 that require a regeneration. The deterministic steps 34 for the new elements 16 may be added to step repository 44, and a regeneration may be instituted so that model 14 accurately reflects the changes.

Step 34 can be of various types and various subclasses. Step 34 may be deterministic or non-deterministic. A deterministic step is one that is always executed when the steps relating to the parents of the atom to which the step relates are executed. A non-deterministic step may be executed even when it is not explicitly touched or added to a regeneration during the process of regenerating model 14. For example, where one wall is connected at its end to another wall, the regeneration of the position of the joined end is a deterministic step because it is determined by the intersection of the two walls' defining curves, and is recomputed when either curve changes. Atoms 24 that relate to deterministic steps are referred to as deterministic atoms. Whether atom 24 is deterministic or not can depend on the state of element 16. For example, if a wall is joined at one end, then the atom 24 for the end of the wall's defining curve is deterministic. If the wall is not joined at its end, the atom 24 would be non-deterministic because it would not depend on any other data, and it could be changed independently by a user.

Relationships between and among elements 16 may be enforced directly using deterministic steps or indirectly using non-deterministic steps. A deterministic relationship was just described. Alternatively, constraints may be placed between or among elements using non-deterministic steps. For example, a dimension may impose a constraint between two walls by establishing a set distance between the walls. The dimension could impose a non-deterministic step by determining, in a particular situation, which wall's position should depend on the other, based on the context.

Step 34 may be of a nul, finish, appearance, or other subclass. A nul step does not perform a function when it is executed; instead, it serves as a placeholder that may initiate a regeneration cycle or perform some other action. A nul step may be created when an element in a drawing model is changed in a manner that would require other elements to regenerate. In such a situation, the nul step may be added to step repository 44 for the atom 24 that corresponds to the changed data.

A finish step is executed after all of the other steps for a particular model 14 or element 16 have been executed. When a finish step for an element 16 executes, it conducts final operations that clean up the graphical representation (Grep) of the element. One particular role of finishing steps is to set boundary boxes for the Grep for elements 16 in model 14 so that elements 16 can be fully calculated. In particular, by calculating the boundary box, the finish step helps ensure that boundary boxes are computed in the proper order. A finish step may be particularly useful with regard to instances and symbols. In particular, because the Grep of an instance does not have its own geometry, but instead points to the Grep for its related symbol, system 10 may wait until the Grep for the symbol is computed before computing the Grep for an instance that points to the symbol.

Certain atoms 24, known as appearance atoms, do not affect the structure of element 16, but instead affect only the manner in which element 16 is displayed. Because an appearance atom does not affect element 16 structurally, a step 34 whose result is an appearance atom (i.e., an appearance step) does not need to propagate like other steps. Instead, the step simply notifies system 10 that the representation of element 16 needs to be updated for any views on model 14 in which element 16 appears. An appearance step may be added to step repository 44 just like any other step.

Appearance steps can be deterministic or non-deterministic. For example, wall element may include a deterministic appearance atom because the wall may be displayed in plan view with a particular hatch pattern, and the hatch pattern style may depend on the parameter of other elements. When the parameters of the other elements change, the hatched wall will need to be redrawn with a new hatch pattern even though none of the wall's structural properties have changed. To prevent the inefficiency of re-computing all of the atoms for the wall when those atoms have not changed, the appearance atom may generate an appearance step for the wall having appropriate parents. Although appearance steps can be a distinct class of steps, system 10 could also achieve similar results by providing a nul step in place of an appearance step, and giving the nul step a result that affects an element's appearance.

Elements that possess geometric characteristics, such as faces and edges in a boundary representation, may also be linked to geometry steps (not shown). Each geometry step may be associated with a step 34. When step 34 associated with a particular geometry step is executed, a regeneration method assigned to the geometry step may be called. The regeneration method may be used to modify the geometry of element 16. In particular, elements 16 may have complicated geometry that can be organized and updated using geometry steps rather than by using steps 34 directly. For example, every wall could be assigned a basic geometry step that creates a slab for the wall. In addition, a geometry step may be context dependent, in that it can be performed only if element 16 to which it is associated holds a particular value. For example, a wall element could have a geometry step that operates on the wall only if the wall contains a window, or only if the wall is joined to another wall.

Information for the element 16 may be stored in an element table. The element table may contain a plurality of element records, each of which contains a pointer to a corresponding element, to an element ID, and to a Grep for the element. When executing, a step 34 may obtain an element ID from the step's corresponding atom 24, and may obtain a corresponding element 16 from the element table using the element ID. Step 34 may also obtain other data from system 10.

The geometry steps for an element may be ordered linearly, so that each step depends on the step before it. In this manner, the element can be constructed in the proper order so that, for example, a window is not cut out of a wall before the wall has been constructed. When an element 16 is regenerated, all or part of its geometry may be regenerated. To allow all of the geometry to regenerate, system 10 may allow geometry steps to generate parent steps that do not propagate. Alternatively, the geometry for an element may be preserved during regeneration, and, when the first geometry step for the element is regenerated, all of the geometry steps up to that step will be regenerated. For example, where two walls are joined at their ends, each wall may have (at least) a base geometry step that creates the basic slab of the wall, and a join geometry step that cleans up the joined end to allow it to mate properly with the other wall. If one of the walls is moved, then the join step of the other wall may need to be regenerated as well. As a result, the base geometry of the wall will also be regenerated, for example, by adding a step for the base geometry step or by executing the base geometry step when the join geometry step is executed.

Each piece of model geometry, such as a face or an edge, may be provided with a tag that identifies the piece uniquely within its associated element. The tags may be assigned identifying numbers in the order of their creation or in another order. In this manner, other components of system 10 may refer to parts within the element. For example, a dimension that refers to the face of a wall could refer to the element ID for the wall and also refer to the tag for the wall's left face. Geometry steps may be added to, or removed from, element 16 when element 16 is created or modified. For example, when a wall is created, it may be given a basic geometry step. When it is joined to another wall, it may be given another geometry step, and when it is unjoined, the geometry step may be removed. Each element 16 may track the geometry that it has created and the various tags it has assigned to the geometry. When a regeneration occurs, the geometry is recreated and the new geometry is given the same tag as the corresponding old geometry. To do so, the element may store pointers to the geometry elements in a tracking table.

Element 16 may be locked to prevent certain changes from being made to element 16. Locking may prevent a user from taking some action with respect to element 16, or it may prevent certain actions from being propagated to or through element 16. For example, a dimension constraint may be incapable of moving a locked element. However, other changes to a locked element may be permitted. For example, where an unlocked wall is joined with a locked wall, movement of the unlocked wall may cause the length of the locked wall to change.

Figure 2:
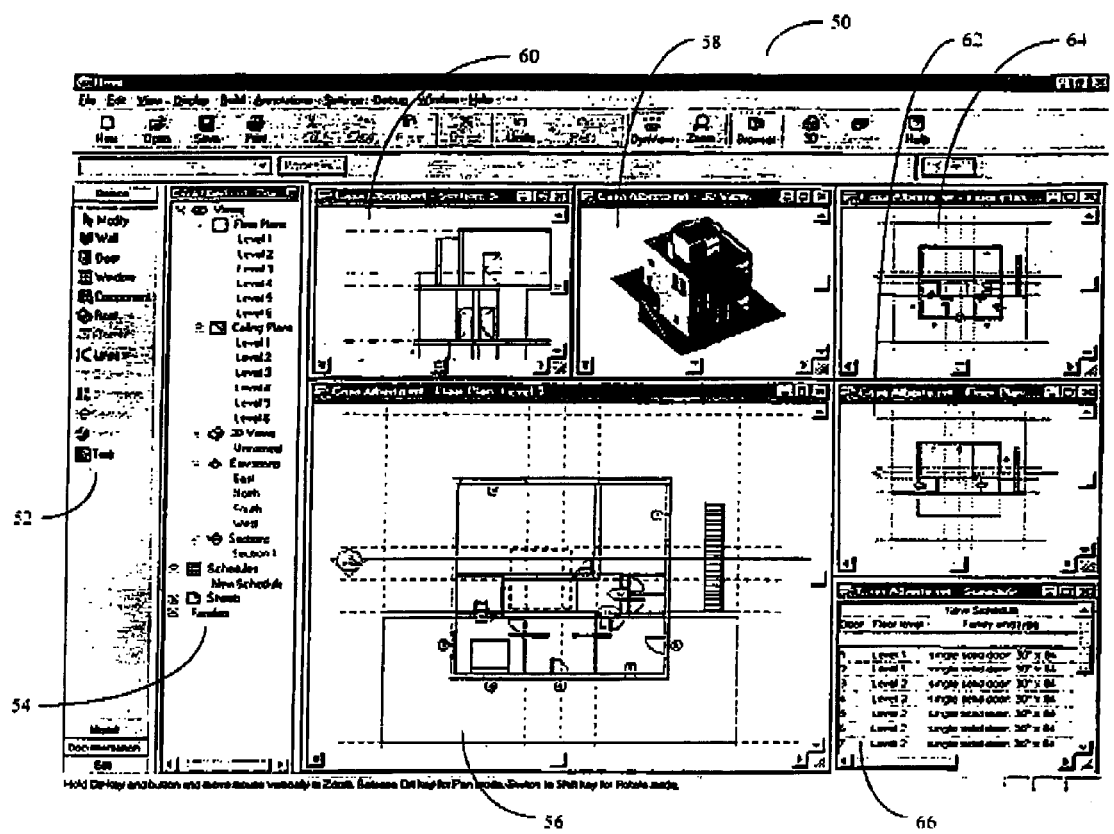
FIG. 2 is a screen shot of a system for producing and displaying graphic images.

FIG. 2 is a screen shot of a system for producing and displaying graphic images. In particular, within a window 50, a number of views of a design model are shown as sub-windows. The design model is a model of a three-story building and is shown in a three-dimensional solid shaded form in view 58. The third level of the building is shown in plan view 56 and plan view 62. Another floor of the building is shown in plan view 64. The building is shown from the side in section view 60. The views may be arranged in any of a number of well-known ways, including by cascading or tiling the windows for the various views, or by providing fewer or greater views. In addition, any view may be "zoomed in" so that a portion of the model is may be observed more closely. Moreover, many of the elements are displayed in a substantially different manner from view to view. For example, although a door is shown in plan view by a series of lines and an imaginary door-swing arc, according to the ordinary symbol for a door, the same door is not shown as a vertical extrusion of the lines and arc when viewing the model from an oblique angle. Rather, each door is displayed from the oblique angle as an opening in a wall or as a thin rectilinear box next to a similarly-sized opening in a wall.

Window 50 contains components beyond the views just discussed. For example, sub-window 66 shows a schedule of some elements in the model. In particular, the doors of the building are shown in order, and each door's location and size is indicated. In a parametric modeling system, the values of the parameters shown in sub-window 66 may be related to the elements pictured in the views in any of a number of ways that are well known in the art. Organizational information for the model and project is provided in sub-window 54. For example, various views of the model or schedules related to the model may be selected and managed through sub-window 54. In addition, design elements may be provided at sub-window 52. A user may select an icon, such as a "door" icon in sub-window 52, and the system may assist the user in adding a door to the model.

When a regeneration occurs, the changes to atoms that have accumulated, and the corresponding steps that have been created, need to be applied to the model. The changes may be made to the model through three phases: propagation, sorting, and executing. The propagation phase determines which steps must be regenerated, given all the steps that have accumulated since the last regeneration. The sorting phase places the various steps in topological order, so that parent steps are executed before their associated child steps (and by extension, grandparent steps are executed before parent or child steps). The execution phase involves executing all the steps and changing the data within project 12 accordingly.

The regeneration phases just described may be book-ended by a pre-regeneration update and a post-regeneration update. These two updates may step through all or part of the data in project 12 element-by-element, and perform operations on elements that should occur before the body of regeneration begins, including cleaning up atoms to make them ready for regeneration. The pre-regeneration update may help ensure that constraints between elements are properly handled by the regeneration process. For example, line elements may be grouped into a "sketch," which may determine the positions of the lines in accordance with a system of constraints. The constraints may be determined by dimensions in the model. To compute the position of the lines in accordance with the constraints in a correct and consistent way, the system of constraints should be complete but not redundant. To achieve this, the pre-regeneration update may ensure that dimension constraints are created or removed so that the non-dimension elements are properly constrained. Actions taken by the post-regeneration update can include removal of symbols that are no longer needed by system 10. For example, each type of window in each type of wall may require a symbol, and if there are many of the same type of window in the same type of wall, they could all share a symbol for efficiency. If the last window of a given type in a given type of wall is deleted or is changed to a different type, the corresponding symbol may be deleted (and a new symbol may be created) during the post-regeneration update.

Figure 3:
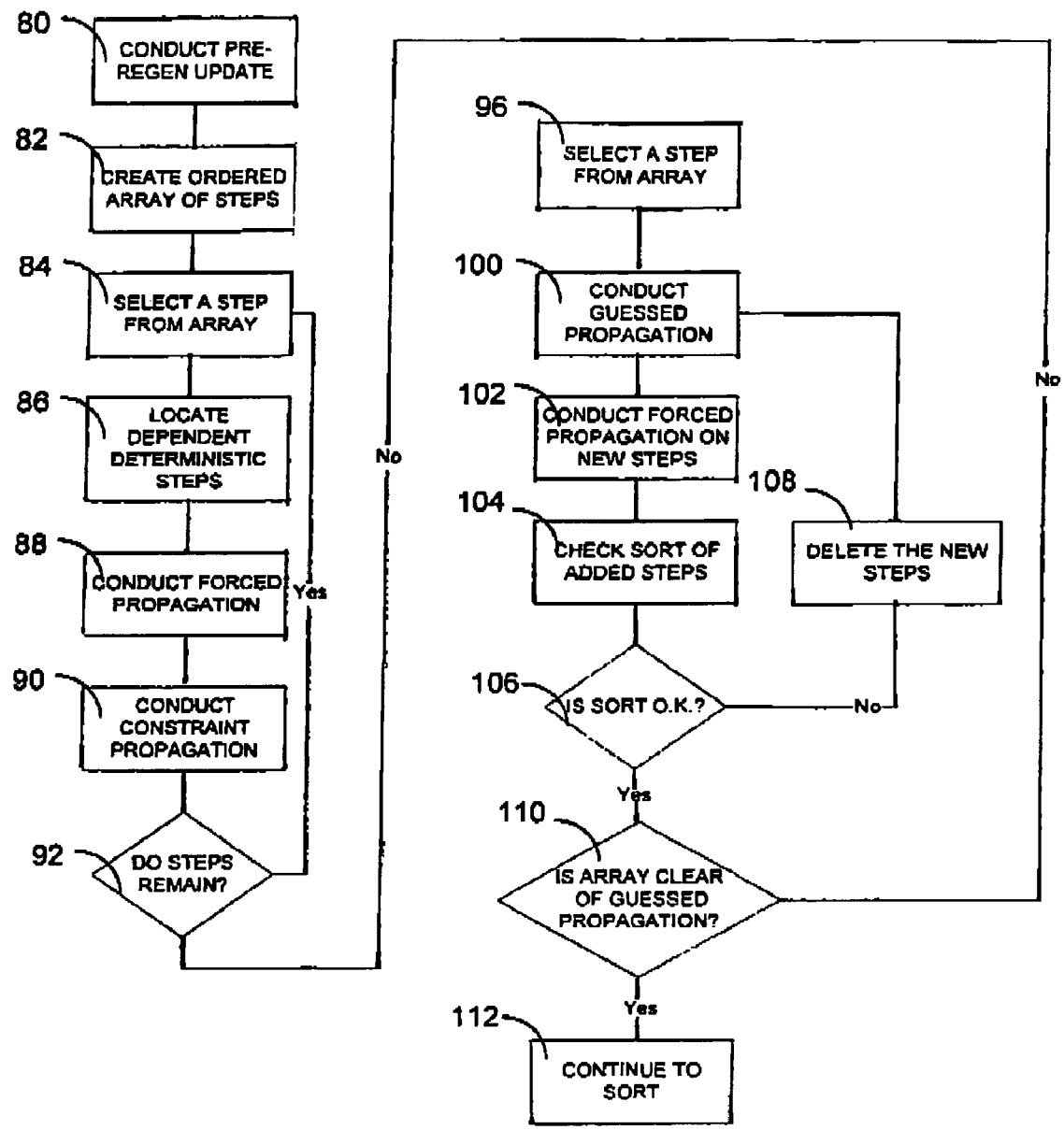
FIG. 3 is a flowchart of a process for propagating changes made to a design model through the model.

FIG. 3 is a flowchart of a process for propagating through a design model changes that have been to the model in general, steps may operate directly on elements to make changes to the elements. Each step may be created as the result of an atom being touched, and may operate on the atom's element using its element ID. Additional steps may have to be added to the system for an element so that other steps that have already been established for the element may execute properly. The added steps may be computed in a forced manner or a guessed manner. In the former, the additional steps are computed according to a predetermined rule, while in the latter, guesses are made regarding what steps to create, the created steps are tested, and, if the created steps are not correct, the guessing process repeats with new guesses. Because the system may make bad guesses if it uses incomplete information, and because forced propagation adds more information to the propagator, the system may conduct all possible forced propagation before it does any guessed propagation. Also, because several guesses may be necessary, guessed propagation may take significantly more time than forced propagation. It may be preferred, therefore, to conduct guessed propagation after forced propagation to minimize the amount of system resources needed to conduct a regeneration.

As an initial step, the pre-regeneration update 80 is performed. The propagating phase may be implemented as an iterative process that seeks to ensure that no steps that have accumulated (for example, in the step repository) since the last regeneration will interfere with other accumulated steps. For example, the steps may be checked to ensure that there are no circular dependencies among the steps. Initially, the system may create an ordered array of steps 82 by referencing the step repository. The system then selects a step from the array 84. The system locates deterministic steps 86 that correspond to atoms that are the offspring of the selected step.

For the selected step, the system then conducts forced propagation 88 and forced constraint propagation 90 on the step. Forced propagation 88 allows elements to add additional steps to the steps that already exist in the step repository or that have been added outside the step repository. Each element may have an associated method that defines what steps need to be performed when the element is changed in a particular manner. Thus, for each regenerated atom corresponding to a particular element, the step propagation method relating to the element is performed. However, the method performed for an element can vary depending on atoms or steps that are already being regenerated by the system.

For example, a user may place a desk near a wall and specify a distance that the desk must be located away from the wall. If the wall is moved, the desk should be moved; in contrast, if the wall stays in place, the desk may be moved away from the wall. The constraint between the desk and the wall may not be best implemented with only deterministic steps since the desk's position might be changed using a move function, so that its position would not deterministically depend on the location of the wall. As a result, the relationship is context-dependent, rather than wholly deterministic. In such a situation, the desk may have an atom whose parents are atoms of the wall. The desk's atom may simply be a placeholder that does not correspond to any data in the model, and its corresponding step may do nothing when executed. Rather, when the atom causes propagation of changes made to the desk, the step repository may be checked to determine whether the desk is already set to be regenerated (e.g., if the desk was moved by a user of the system). If it is, the constraint between the desk and the wall may be overridden, and a step may be added to compute a new distance between the wall and the desk. If it is not, a step may be added to recomputed the position of the desk to satisfy the constraint. As a result, the steps that are generated may be different if the desk is moved relative to the wall than if the wall is moved relative to the desk.

Once the forced propagation 88 is completed, constraint propagation 90 occurs. Constraint propagation 90 is similar to forced propagation 88 in that both are used to add steps to the regeneration process based on atoms or steps that are in the step repository or have otherwise been created. While forced propagation 88 allows an element to propagate changes in its own atoms, constraint propagation 90 allows an element to propagate changes in the atoms of other elements. With constraint propagation 90, the system determines which elements have placed constraints on other elements. For example, a stair element may place constraints on separate elements that correspond to the boundary and riser curves or the stair. Alternatively, an element could place constraints on another, less related element. For example, one wall in a pair of intersecting walls could place a constraint on the position of the end of the other wall in the pair. Although forced propagation is shown as occurring before constraint propagation, the order of propagation, like the order of other steps in the process, is not critical.

When the forced propagation and constraint propagation for the selected step are complete, the system checks to determine whether other steps remain for which propagation must be conducted 92. The cycle of forced and constraint propagation may be repeated for each step until no steps remain.

When all possible forced and constraint propagation is completed, the system works through the array of steps again, this time conducting guessed propagation. For each step that could produce more than one outcome, the system determines which outcome is correct. In particular, the system may store a list of preferred outcomes for a particular step, select one outcome, and propagate the steps that are needed to produce that outcome.

In one mode, the system may be programmed to first propagate steps for the outcome that is statistically most likely to be the correct outcome. For example, a number of elements could be added to the model at varying distances from each other. A constraint could then be added to the elements that requires them to be equally spaced. Because the constraint cannot be satisfied by the elements as they were originally created, the system must change the elements so that they meet the constraint. In such a case, the system could be programmed to prefer the solution of fixing the outer elements and spacing the remaining elements equally between the outer elements. As a result, such a solution could be programmed as the first guess. If two or more of the elements are locked or otherwise unavailable for being moved to satisfy the constraint, the system could know which element or elements needed to be moved, and would not have to make a guess. Where there are multiple possible guesses, the system may select the appropriate guess in a predetermined manner, or may present the result of one or more guesses to a user for manual selection.

As another example, guessed propagation may also be used to maintain the spatial relationship between two joined colinear walls. When one wall is moved, the other must also be moved to maintain colinearity. However, the join point of the walls does not have to be defined in all three dimensions, because it can range along the line of colinearity between the walls. In contrast, the joined point of joined non-colinear walls may be established deterministically. Therefore, when one collinear wall is moved, the positioning of the other wall requires a guessed step that may look to the previous position of the second wall and the movement of the first wall in computing a new proper position for the wall. Because the position of the second wall along the line of colinearity could be determined by some other action that has been performed on the model, by delaying the guessed propagation until after the forced propagation has occurred, the propagation process may operate more efficiently. Similarly, arcs tangent to one or two walls may be repositioned by guessed steps. In such a situation, the radius of the arc could be determined by another constraint so that its radius would not be a guess, or it could be otherwise unconstrained, so that its radius would be a guess.

As another example, guessed propagation may be used to handle walls that are locked in a particular face-to-face distance. When some action is performed on one of the walls, the locked dimension will operate to maintain the walls at the same spaced distance. Guessed propagation may be used to select an appropriate location for the second wall. The step to be determined will have for parents any atoms that determine the position of the first wall, and will in turn compute the position of the second wall. When the space between the walls is center-to-center, the parent atoms will be the centerline of the first wall, while if the space between the walls is face-to-face, the parent atoms will also include an atom for the width of the walls. The step is guessed rather than forced in a face-to-face situation because, when the width of one wall changes, one of the walls must move to satisfy the constraint, but it could be either wall.

When a guess has been made for a step, the step may need to add additional steps to reach the desired result. Forced propagation 102 is then conducted on each of the steps from the guessed propagation. The steps are then checked 104 to determine whether they can be sorted properly, as a means to determine whether the particular guess was correct. That is, it is possible that a guessed propagation will add step A, which depends on step B, which is already part of the step repository. The ensuing forced propagation of step A could create step C, which is dependent on A. Nothing in the creation of step C prevents step C from being a parent of step B, so a circle of dependency could be created (C needs to follow A, A needs to follow B, and B needs to follow C). The ability of the added steps to be sorted may be determined by a search process like that described below in reference to FIG. 4, conducted only on the added steps.

Referring again to FIG. 3, if this process determines that the new steps cannot be sorted properly 106, the system may direct the deletion of all the additions or changes that have been made to the steps 108 since the incorrect guess was made. The cycle of guessed propagation 100 followed by forced propagation 102 on each of the added steps may be repeated until an entire pass is made through the array without the need to conduct any guessed propagation 110. Once the propagation is completed, sorting may occur 112.

Figure 4:
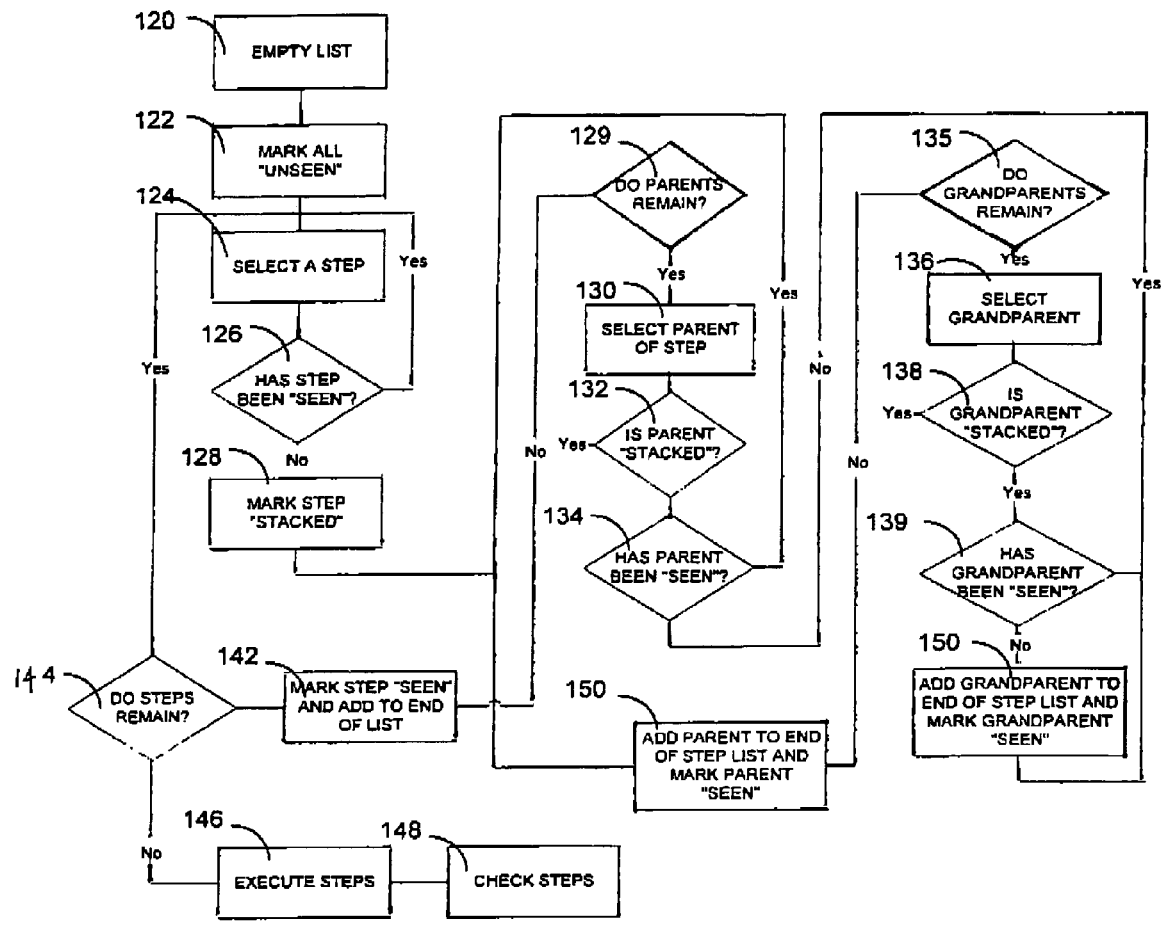
FIG. 4 is a flowchart of a process for applying propagated changes to a design model.

FIG. 4 is a flowchart of a process for applying propagated changes to a design model. The application of the changes to the model may begin with a sorting phase. The sorting process places each step in a position so that each of the steps may be executed in the proper order, and so that no step is executed until all of its parents have been executed. The sorting process may be conducted using a standard depth-first sorting scheme. As a first step in the sorting process, an empty list 120 may be created, and accumulated steps, for example, from a step repository, may be added to the list. All of the steps may be marked initially as "unseen" 122 to represent that they have not yet been processed by the sorter.

With the list of unsorted steps established, an iterative pass may be made through the steps to place them in order. The first step in the list, may first be selected 124. The step may be checked to determine if it has been seen 126. If the step has been seen, that may indicate that sorting has already been performed with respect to the step, and another step may be selected 124. If the step has not been seen, the step may be marked "stacked" 128 to indicate that the step and its ancestors are being processed.

If the step has no parents 129, the system may mark the step seen and add it to the end of the list 142. If the step has parents 129, the sorting phase may select a parent 130 of the selected step, and check whether the parent is "stacked" 132. If the parent is stacked, that may mean that the parent is also a descendent—child, grandchild, great-grandchild, etc.—of the step. As a result, the system may generate a regeneration error because there is a circular chain of dependencies among the elements that correspond to the particular steps. If the parent is not stacked, the system may determine whether the parent has been seen 134. If the parent has been seen, this would indicate that the parent step has already been processed and that the parent and its ancestors have been sorted. Thus, if the parent step has been seen, the system moves to the next parent 130. If no parents remain 135, the system selects the next step.

If the parent has not been seen, then the parent and its ancestors need to be sorted. To start the sort, the system determines whether there is a grandparent 135. If there are not, the parent is added to the list and marked "seen" 150, and the system moves to the next parent. If there is a grandparent, it is selected 136, is checked to determine whether it is stacked 138, and is checked to determine whether it has been seen 140, in a similar manner to that in which the parent was checked. If it has not been seen, it is add to the list 150, and the system moves to the next parent. Although FIG. 4 shows only checking and sorting to the grandparent level, the process may be conducted recursively until all ancestors of a step are exhausted. As each level of the sorting of a step and its ancestors is completed, the particular step may be added to end of the list of steps and the step may then be marked as seen 142. The system may then determine whether additional steps remain 144, and repeat the process if necessary until all of the steps have been marked seen.

Once the list of steps is produced, the steps may be executed and may make changes to elements. Execution of a step may be a simple value change, such as moving the centerline of a wall, or it may create a larger rebuilding of model geometry. For example, a nul step may do nothing when executed, and may instead simply serve as a placeholder for other actions that take place outside of regeneration. Steps that are propagated by constraints may change another piece of data, for example by calling for a "move" function to be performed on the data. Other steps may cause an element's geometry to be rebuilt, for example by extruding the slab of a wall or punching a hole in a wall for a window or a door. Some elements, such as dimensions, may have a step that rebuilds each part of the element based on parent elements.

To speed the execution process, certain steps that are created during the regeneration process may be skipped and not be executed. For example, if a step's execution does nothing, then there is no need to execute steps that depend on it. Steps that do nothing may be marked "constant" so that they can be recognized during regeneration and skipped. In particular, steps may be marked as "constant" if all their parents are marked constant or are otherwise not being regenerated. In addition, if a step was added during propagation, but all of its parents are constant, there is no need for the step to be executed, and it may be marked as constant.

The practice of marking steps constant may be used to regenerate massing models efficiently. Massing models are used by architects to envision the general size and shape of a building. As a result, they generally do not contain many details (such as interior walls) and generally look like white joined geometric shapes, such as spheres, cones, boxes, cylinders, and pyramids. Massing models may be established by the system when a user builds the original rough model. The user may then work off of the massing model by adding details, such as walls, doors, and windows, to the model. Even when the user has added details to the model, the user may be given the option of viewing the model in its massing form. Certain details may be dependent on parts of the massing so that if the user changes the massing, the system will update the details, if necessary, to reflect the change. However, if the massing is changed in a minor way, many of the details that are dependent on the massing will not need to be changed. One way in which to avoid executing changes for each detail is to mark steps for the unchanged details as constant.

After the steps are executed, the model may be checked to determine whether the model constraints are satisfied by the post-regeneration model information. This constraint checking is performed at the end because, until the end, the steps are not finalized and there may be no step to satisfy a particular constraint. For example, a pair of elements may have two locked dimensions between them. The locked dimensions will each produce a constraint between the elements, so that if one of the elements is moved, both constraints will try to move the other element. However, only one of the constraints may add a step that would satisfy the constraint. The system allows this type of over-constraining, but masks it by executing only one of the steps that has been created, and checking both constraints to verify that they are satisfied.

Figure 5A:
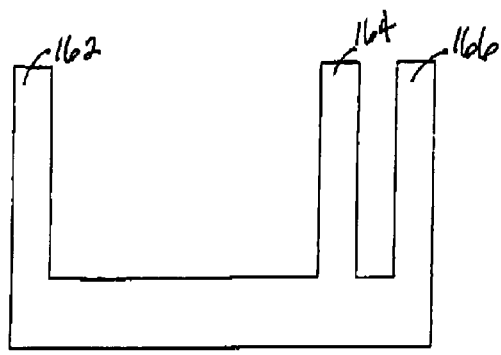
FIGS. 5A-5D are images of a design model within which changes are propagated.
Figure 5B:
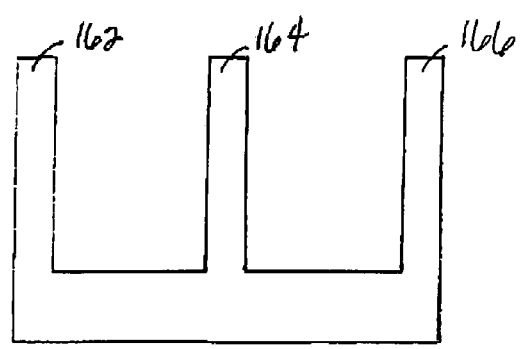
Figure 5C:
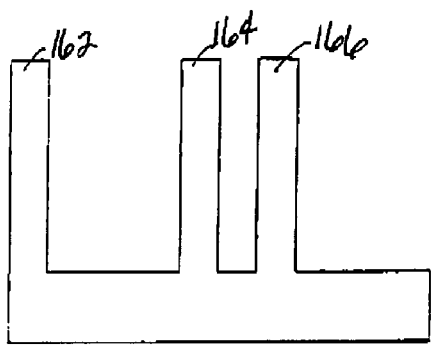
Figure 5D:
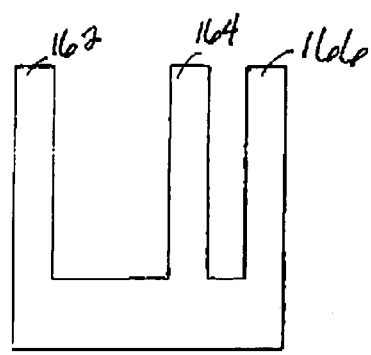

FIGS. 5A-5D show a model comprising three parallel walls 162, 164, 166, that are perpendicular to another wall 160. FIG. 5A shows a starting position for the walls, with walls 162, 166 at the opposite ends of wall 160, and wall 164 located nearer wall 166 than wall 162. FIG. 5B shows the model after an equal spacing constraint has been imposed on the walls 162, 164, 166. Although which of the three walls to be moved as a result of the constraint may not be specified, the system may select wall 164 according to a predetermined rule using guessed propagation. For example, a rule may state that outside walls that are fixed at their ends should not be moved if possible. FIG. 5C shows the model after one of walls 164, 166 has been moved, and there is a spacing constraint between the walls. Note that the atom corresponding to the endpoint of wall 166 does not have a deterministic relationship to the atom corresponding to the endpoint of wall 160, so that wall 166 may move without affecting wall 160. In contrast, in FIG. 5D, the relationship between the endpoint of wall 166 and the endpoint of wall 160 is deterministic. Thus, when wall 164 is moved, it imposes a constraint on wall 166 based on the fixed distance defined between the walls. Likewise, wall 166 imposes a deterministic constraint on the endpoint of wall 160. As a result, when wall 164 is moved, wall 166 moves along and drags with it the end of wall 160.

As described, the regeneration method is context-dependent. In other words, instead of plowing through all of the steps needed to display a drawing from beginning to end, the method may conduct the regeneration process in a manner that depends on the type of changes that have been made to the drawing model. In addition, although the data that is regenerated in the examples above relates to graphic models, the propagation and regeneration systems and methods described above could work equally on other types of models, for example, in "if-then" data and financial modeling applications.

The process may be carried out in a context dependent manner, in that the steps that are executed, and the order in which they are executed, may depend on what changes were made to the model. In contrast, history-based systems generally execute the same steps in the same order regardless of the changes made to the model. Such systems may be optimized to execute only a subset of the whole set of steps, but those steps would still be executed in a fixed order, and, except for execution time, the result is the same as executing all the steps.

Regeneration may be triggered in a variety of ways. For example, when elements in a model are moved, regeneration may occur. In particular, when the move function changes a piece of data, such as an element, it may "touch" an atom corresponding to that data. The function may then directly or indirectly notify the system that the data corresponding to the atom has changed, so that any atom that depends on the initial atom must be regenerated. In such a situation, a regeneration could be triggered by the move itself. Any tool that modifies an element could also trigger a regeneration, and the system may be established to ensure that tools trigger a regeneration when needed. In addition, regenerations may be instituted manually.

Advantageously, the regeneration method described can provide for greater flexibility in a computer-aided design or other data manipulation and analysis system. In particular, the method may provide for a robust and accurate data representation of a model, and may also permit the model to be generated more quickly. In addition, because the method may manage the generation of a single central model, the system may more easily manage the display of the model to a user. Also, changes to model components may be reflected in documentation symbols, and changes in documentation symbols may be reflected in model components, so that the system may provide full bi-directional association between elements, for example between a model component and an associated documentation symbol. And changes in one model component may be reflected almost instantly in other model components.

Figure 6:
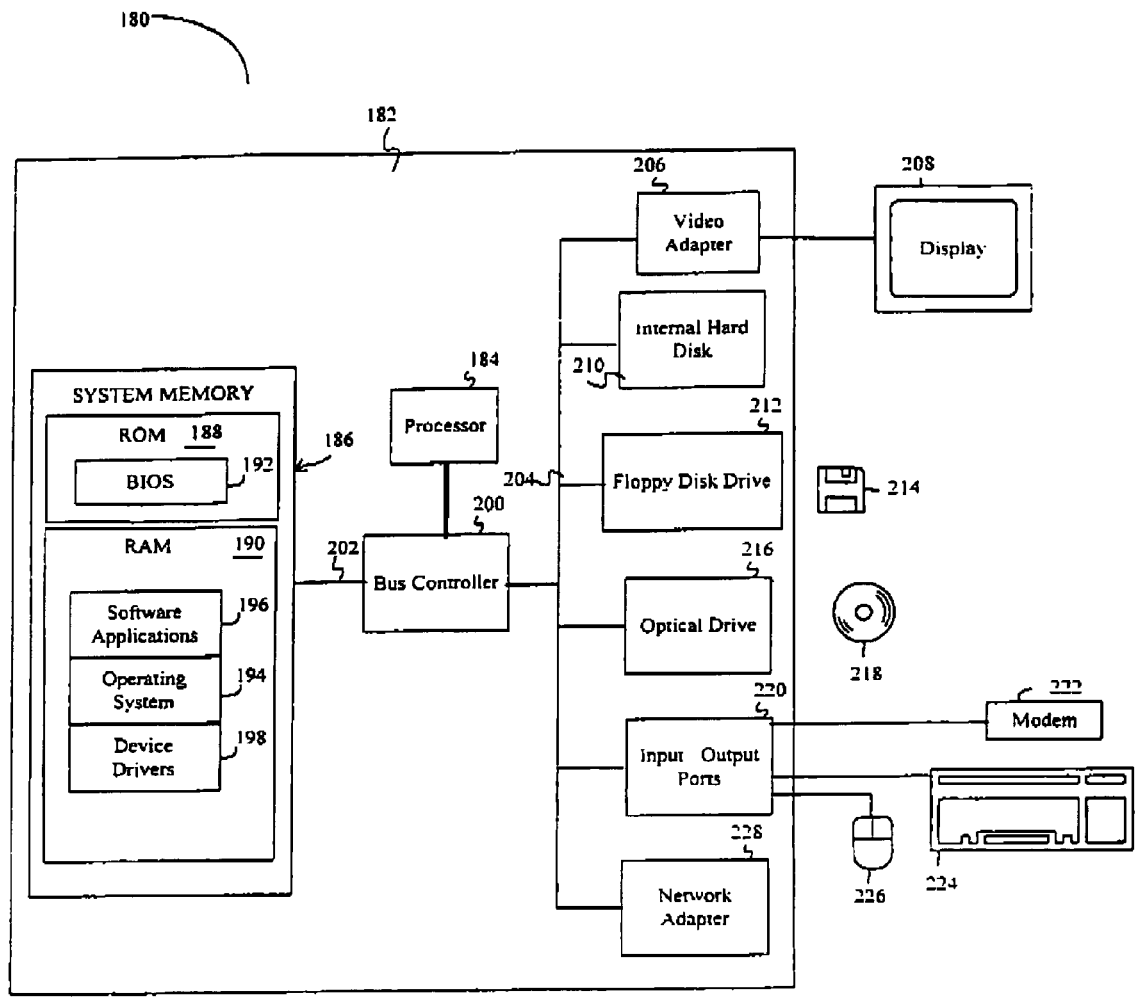
FIG. 6 is a block diagram of a system for producing and displaying graphic images.

FIG. 6 illustrates a programmable computing system (system) 180 that provides an operating environment suitable for implementing the techniques described above. The system 180 includes a computer 182 that contains a processor 184 connected to system memory 186 through bus controller 200 and system data/address bus 202. Memory 186 includes read only memory (ROM) 188, which may include BIOS 192 or other components, and random access memory (RAM) 190, which may be used to store an operating system 194, software applications 196, and various device drivers 198. In one embodiment, however, software applications 196 are stored in ROM 188 and are copied to RAM 190 for execution, or are executed directly from ROM 188. In various configurations, system 180 represents any server, personal computer, laptop or even a battery-powered, pocket-sized, mobile computer known as a hand-held PC or personal digital assistant (PDA). System 180 could also represent a variety of processors, communications devices, and storage devices tied together in a network, included a local area network (LAN), a wide area network (WAN), a virtual private network (Intranet), or the Internet.

Bus controller 200 may connect to other devices through input/output bus 204. For example input/output bus 204 may support a video adapter 206 connected to display 208 (or multiple displays) to provide visual output for system 180. Bus controller 200 may also support any of a number of input or storage devices, such as internal hard disk 210, floppy disk drive 212, which accepts floppy disk 214, and optical drive 216, which accepts optical disk 218. Other devices, such as modem 222, keyboard 224, and mouse 226, may be connected to input/output bus 204 through input/output ports 220. Other types of input devices (not shown) include track pads, track balls, joysticks, data gloves, head trackers, and other devices suitable for positioning a cursor on the video display 208, or for otherwise providing directions to system 180. In addition, network adapter 228 may be provided to give system 180 access to external resources, such as a LAN, WAN, VPN, or the Internet.

A number of embodiments of the invention have been described. Nevertheless, it will be understood that various modifications may be made without departing from the spirit and scope of the invention. For example, as noted, the invention is not limited to graphical models, and could be applied to other types of data models. In addition, all of the steps described do not have to be performed in every situation, and the steps could be performed out of order or interleaved. Accordingly, other embodiments are within the scope of the following claims.

What is claimed is:

1. A computer-implemented method of propagating changes made in one data element to a related data element, comprising:
    accumulating, by a processor, the changes made in the one data element using a unique element ID;
    identifying, by the processor, a predetermined plurality of possible different sets of changes that may be made in the related data element;
    selecting, by the processor, a most appropriate set of changes by employing a predetermined selection standard; and
    testing, by the processor, the selected set of changes to determine whether it is an appropriate set of changes, wherein testing the selected set of changes comprises verifying the one data element and the related data element for constraint satisfaction.

2. The computer-implemented method of claim 1, wherein the one data elements includes a plurality of subelements.

3. A computer storage medium storing a software application executable to cause one or more computers to perform operations of propagating changes made in one data element to a related data element, the operations comprising:
    accumulating the changes made in the one data element using a unique element ID;
    identifying a predetermined plurality of possible different sets of changes that may be made in the related data element;
    selecting a most appropriate set of changes by employing a predetermined selection standard; and
    testing the selected set of changes to determine whether it is an appropriate set of changes, wherein testing the selected set of changes comprises verifying the one data element and the related data element for constraint satisfaction.

4. The computer storage medium storing the software application of claim 3, wherein the one data element includes a plurality of subelements.

5. A system comprising:
one or more computers configured to perform operations of propagating changes made in one data element to a related data element, the operations including:
accumulating the changes made in the one data element using a unique element ID;
identifying a predetermined plurality of possible different sets of changes that may be made in the related data element;
selecting a most appropriate set of changes by employing a predetermined selection standard; and
testing the selected set of changes to determine whether it is an appropriate set of changes, wherein testing the selected set of changes comprises verifying the one data element and the related data element for constraint satisfaction.

6. The system of claim 5, wherein the one data element includes a plurality of subelements.

* * * * *

UNITED STATES PATENT AND TRADEMARK OFFICE
CERTIFICATE OF CORRECTION

PATENT NO. : 7,768,526 B2
APPLICATION NO. : 11/050465
DATED : August 3, 2010
INVENTOR(S) : Irwin Jungreis and Michael R. Lauer It is certified that error appears in the above-identified patent and that said Letters Patent is hereby corrected as shown below:

Column 16, Line 50 at Claim 2; replace:
"the one data elements includes a plurality of subelements" with
-- the one data element includes a plurality of subelements --

Signed and Sealed this

Twenty-third Day of November, 2010

David J. Kappos
*Director of the United States Patent and Trademark Office*